United States Patent [19]

Takahashi et al.

[11] Patent Number: 5,510,197
[45] Date of Patent: Apr. 23, 1996

[54] LEAD FRAME MATERIAL AND LEAD FRAME FOR SEMICONDUCTOR DEVICE

[75] Inventors: Shunji Takahashi; Seizo Masukawa; Rensei Futatsuka; Tetsuya Sugimoto; Takeshi SUzuki; Chuzo Azuma; Yuichi Kanda; Takao Fukatami, all of Aizuwakamatsu, Japan

[73] Assignee: Mitsubishi Shindoh Co., Ltd., Tokyo, Japan

[21] Appl. No.: 233,460

[22] Filed: Apr. 26, 1994

[30] Foreign Application Priority Data

Apr. 28, 1993 [JP] Japan ................................. 5-103260
Nov. 9, 1993 [JP] Japan ................................. 5-279912

[51] Int. Cl.⁶ ........................... B32B 15/20; H01L 23/495
[52] U.S. Cl. ........................... 428/670; 428/672; 428/673; 428/675; 428/938; 257/666
[58] Field of Search ........................... 428/670, 671, 428/672, 673, 675, 926, 938, 929; 257/666

[56] References Cited

U.S. PATENT DOCUMENTS

| | | | |
|---|---|---|---|
| 4,188,438 | 2/1980 | Burns | 428/209 |
| 4,529,667 | 7/1985 | Shiga et al. | 428/673 |
| 4,594,221 | 6/1986 | Caron et al. | 420/485 |
| 4,656,003 | 4/1987 | Miyafuji et al. | 420/473 |
| 4,883,774 | 11/1989 | Djennas et al. | 428/673 |
| 4,894,752 | 1/1990 | Murata et al. | 361/421 |
| 5,139,890 | 8/1992 | Cowie et al. | 428/672 |
| 5,292,559 | 3/1994 | Joyce et al. | 428/672 |
| 5,360,991 | 11/1994 | Abys et al. | 257/666 |
| 5,384,204 | 1/1995 | Yumoto et al. | 428/670 |
| 5,436,082 | 7/1995 | Mathew | 257/666 |

*Primary Examiner*—John Zimmerman
*Attorney, Agent, or Firm*—Pearne, Gordon, McCoy & Granger

[57] ABSTRACT

A lead frame material comprises a base plate consisting of copper or copper alloys, and a protective coating formed on the upper or the both surface of the base plate. The protective coating is composed of at least one metal selected from the group consisting of gold, gold alloy, silver, silver alloy, palladium and palladium alloy, and has a thickness of 10–500 angstrom. The protective coating is formed by means of vapor deposition. It is possible to form an intermediate coating of nickel or nickel alloys between the surface of the base plate and the protective coating, by means of vapor deposition or wet plating. The suitable thickness of the intermediate coating is within the range of 50–20000 angstrom.

12 Claims, 9 Drawing Sheets

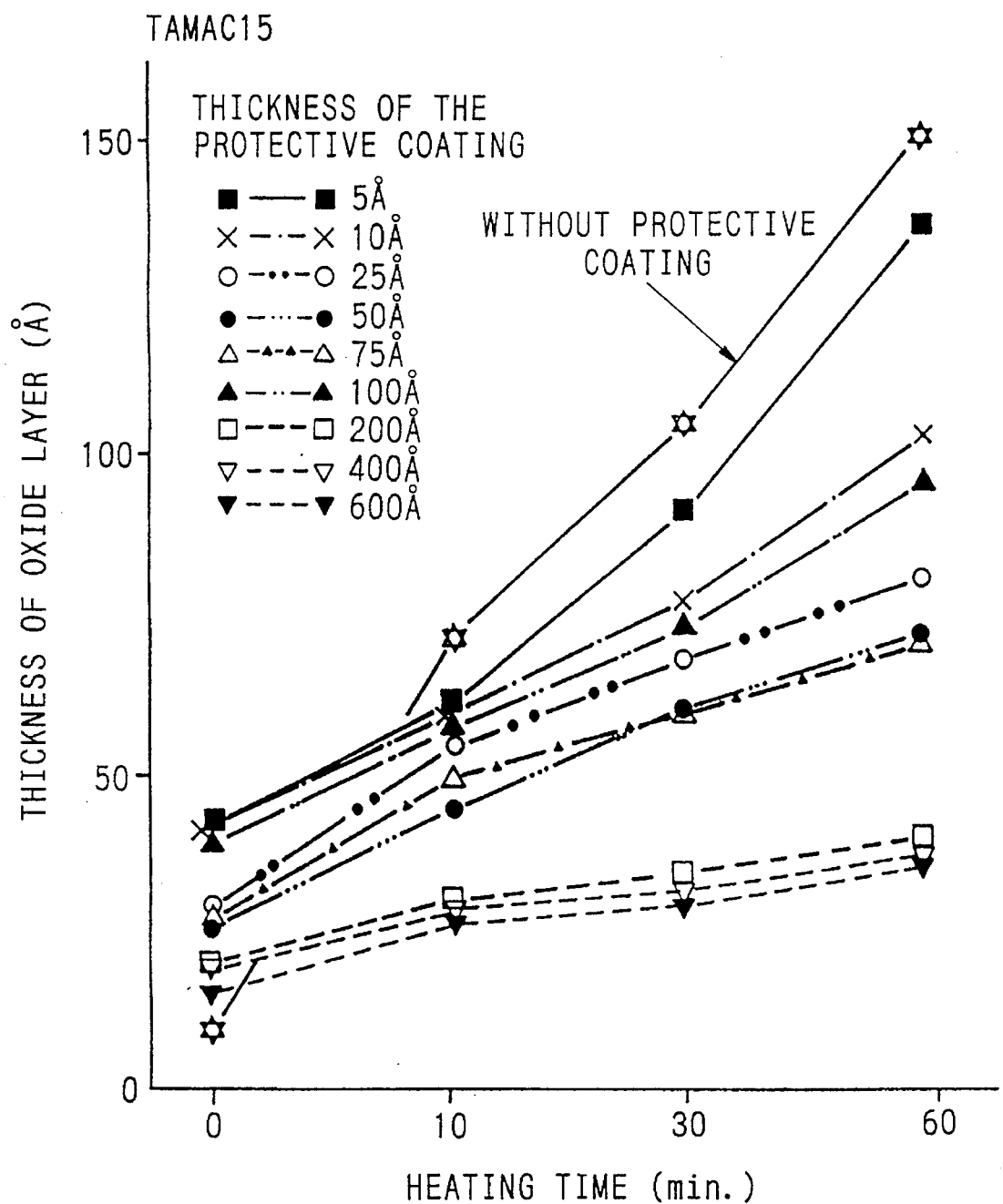

LEAD FRAME MATERIAL AND LEAD FRAME FOR SEMICONDUCTOR DEVICE

BACKGROUND OF THE INVENTION

1. Field of the Invention

The present invention relates to a lead frame for semiconductor device, having a protective coating for improving the reliability of wire bolding to the lead frame.

2. Description of Related Art

Lead frame is a thin metal plate produced by punching a metal strip of copper or copper alloys, and includes die pads on which semiconductor chips are fixed, inner leads to be connected to semiconductor chip, and outer leads to be connected to printed circuit board. Semiconductor devices, such as transistors and integrated circuits, are manufactured by the processes of fixing semiconductor chips on the die pads of the lead frames, connecting each of bonding pads (electrodes) of the chips to the corresponding one of the inner leads of the lead frames by means of wire bolding, and forming packages to cover the chips. In the conventional wire bolding, fine wires of gold or aluminum are mainly used as bonding wires.

The surface of the lead frame is easily oxidized by contact with air, and the bonding strength between the bonding wires and the inner lead decreases as the oxide layer grows thicker. In such cases, the risk arises that defective semiconductor device will be increased drastically.

One of the effective means to avoid such a risk is to carry out the wire bonding in a reducing atmosphere. However, this method requires not only expensive reducing gas, but also demands complicated operations for maintaining a suitable reducing atmosphere.

Another means for preventing the drop in bonding strength by the oxidation is to form a gold layer on the surface of the lead frame by electroplating. In this case, the thickness of the protective coating must be more than several microns, because electroplated gold layers of less than several microns cannot provide sufficient effect for preventing the oxidation of the surface of the lead frame. Therefore, a considerable amount of gold is required for electroplating, and the manufacturing cost of lead frame becomes expensive.

Furthermore, in the conventional lead frame, in order to facilitate soldering of the outer leads to printed circuit board, it is necessary to form a solder layer on the outer lead by means of electroplating or solder dipping. However, such a process for forming solder layer requires a pretreatment for removing oxide layer of the outer leads, therefore, regarding this point, the conventional lead frame has a drawback that the manufacturing process thereof is complicated and manufacturing cost is high.

SUMMARY OF THE INVENTION

The present invention is directed toward resolving the above problems. Namely, an objective of the present invention is to provide lead frame members which enables to manufacture lead frames having high reliability for wire bonding, with a low manufacturing cost.

In order to accomplish this objective, the lead frame material of the present invention comprises a base plate consisting of copper or copper alloys, and at least a protective coating formed on at least a part of a surface of the base plate. The protective coating is composed of a metal selected from the group consisting of gold, gold alloy, silver, silver alloy, palladium and palladium alloy, and has a thickness of 10–500 angstrom.

According to the lead frame material of the present invention, it is possible to improve the bonding strength between the bonding wire and the inner leads of the lead frame. In spite of this, the manufacturing cost can be significantly reduced as compared to the conventional lead frame having gold layer, since the amount of the noble metal for necessary forming the protective coating is very small. Furthermore, since the protective coating enhances the wet-ability of the lead frame for a melted solder, it is possible to facilitate soldering of the outer leads to a printed circuit board without forming solder layers on the outer leads, and thus the manufacturing cost and complication of manufacturing process of the lead frames can be reduced.

Another objective of the present invention is to provide a lead frame having high reliability for wire bonding which can be produced with a low manufacturing cost.

In order to accomplish this objective, the lead frame of the present invention comprises a lead frame body having inner lead to be wire-bonded and outer lead to be bonded to circuit patterns of printed circuit board, and first protective coatings formed on the surfaces of the inner leads of the lead frame body. The first protective coatings are composed of a metal selected from the group consisting of gold, gold alloy, silver, silver alloy, palladium and palladium alloy, and has a thickness of 10–500 angstrom.

According to the lead frame of the present invention, it is possible to improve the bonding strength between the bonding wire and the inner leads of the lead frame, and further, the manufacturing cost thereof can be significantly reduced as compared to the conventional lead frame having gold layer.

If the thickness of the protective coating is smaller than 10 angstrom, the bonding strength and the wet-ability for melted solder cannot be enhanced. On the other hand, if the thickness of the protective coating is larger than 500 angstrom, it results only in the increasing of manufacturing cost of the lead frame. Considering the manufacturing cost and the above-mentioned effects, the more preferable thickness of the protective coating is within the range of 50–300 angstrom.

It is also preferable to provide an intermediate coating formed between the surface of the base plate and the protective coating. The intermediate coating composes of nickel or nickel alloys and has a thickness of 50–20000 angstrom.

In this case, the intermediate coating can interrupt the heat diffusion of copper or other metals from the base plate into the protective coating, during heat treatment in manufacturing processes of semiconductor devices. Therefore, it becomes possible to carry out the heat treatment of the lead frame under relatively high temperature and long heating time, in comparison with the case of having no intermediate coating. In contrast, if the copper atoms (or other metal atoms) diffuse into the protective coating, the copper atoms reach at the surface of the protective coating, and the risk arises that the exposed copper atoms decrease the wire bonding strength and wet-ability to a melted solder of the lead frame. The intermediate coating of less than 50 angstrom thickness cannot provide the above-mentioned effect. On the other hand, the intermediate coating of more than 20000 angstrom thickness is not necessary.

BRIEF DESCRIPTION OF THE DRAWINGS

FIG. 11 is a graph showing the relations of thicknesses of protective coatings, heating times and thicknesses of oxide layers, in the case where base plates are formed of TAMAC15.

DETAILED DESCRIPTION OF THE PREFERRED EMBODIMENTS

Preferred embodiments of lead frame material and lead frame according to the present invention will be presented with reference to the accompanying drawings.

Figure 1:
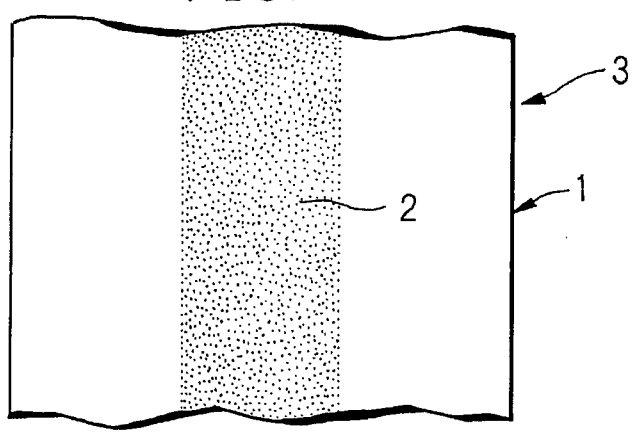
FIG. 1 is a plan view showing an embodiment of a lead frame material of the present invention.

FIG. 1 shows an embodiment of the lead frame material of the present invention. This lead frame material 3 comprises a base plate 1 consisting of copper or copper alloys, and a protective coating 2 formed on the upper or both surface of the base plate 1. The base plate 1 has a long strip shape, and has a constant width of several centimeter and a constant thickness of about 0.1–1.0 millimeter, for example. Of course, the present invention is not limited to this size. In this embodiment, the protective coating 2 is formed on the center area of the base plate 1 so as to have a constant width and to extend along a longitudinal direction of the base plate 1.

Figure 2:
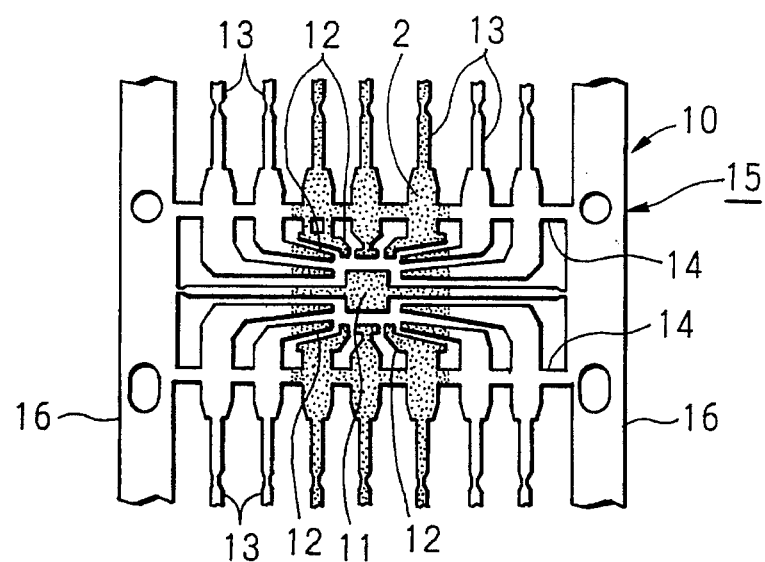
FIG. 2 is a plan view showing a first embodiment of a lead frame manufactured from the lead frame material of FIG. 1.

In contrast, FIG. 2 shows a lead frame 15 which is manufactured from the lead frame material 3 of FIG. 1 by means of punching. This lead frame 15 comprises a lead frame body 10 punched from the base plate 1, and the protective coating 2 formed on the lead frame body 10. The lead frame body 10 comprises die pads 11 on which semiconductor chips (not shown) are to be fixed, inner leads 12 to be wire-bonded to the chips, outer leads 13 to be bonded to circuit patterns of printed circuit board, and tie bars 14 connecting the outer leads to a pair of support portions 16.

Figure 3:
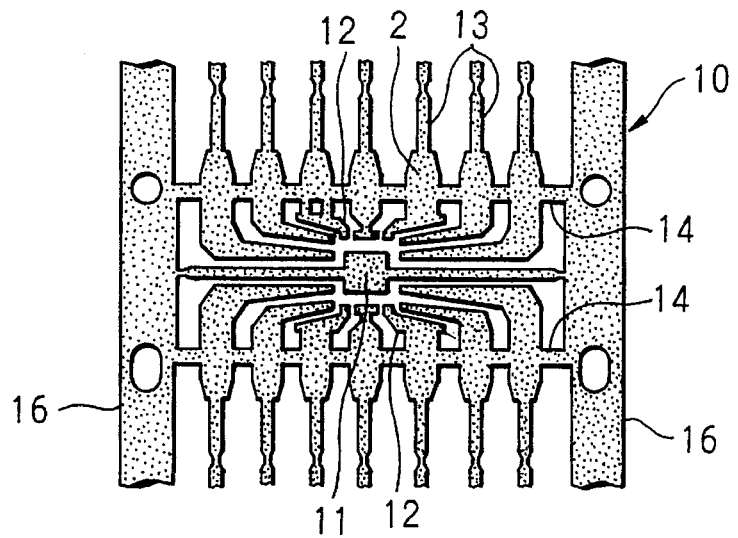
FIG. 3 is a plan view showing another embodiment of the lead frame of the present invention.
Figure 4:
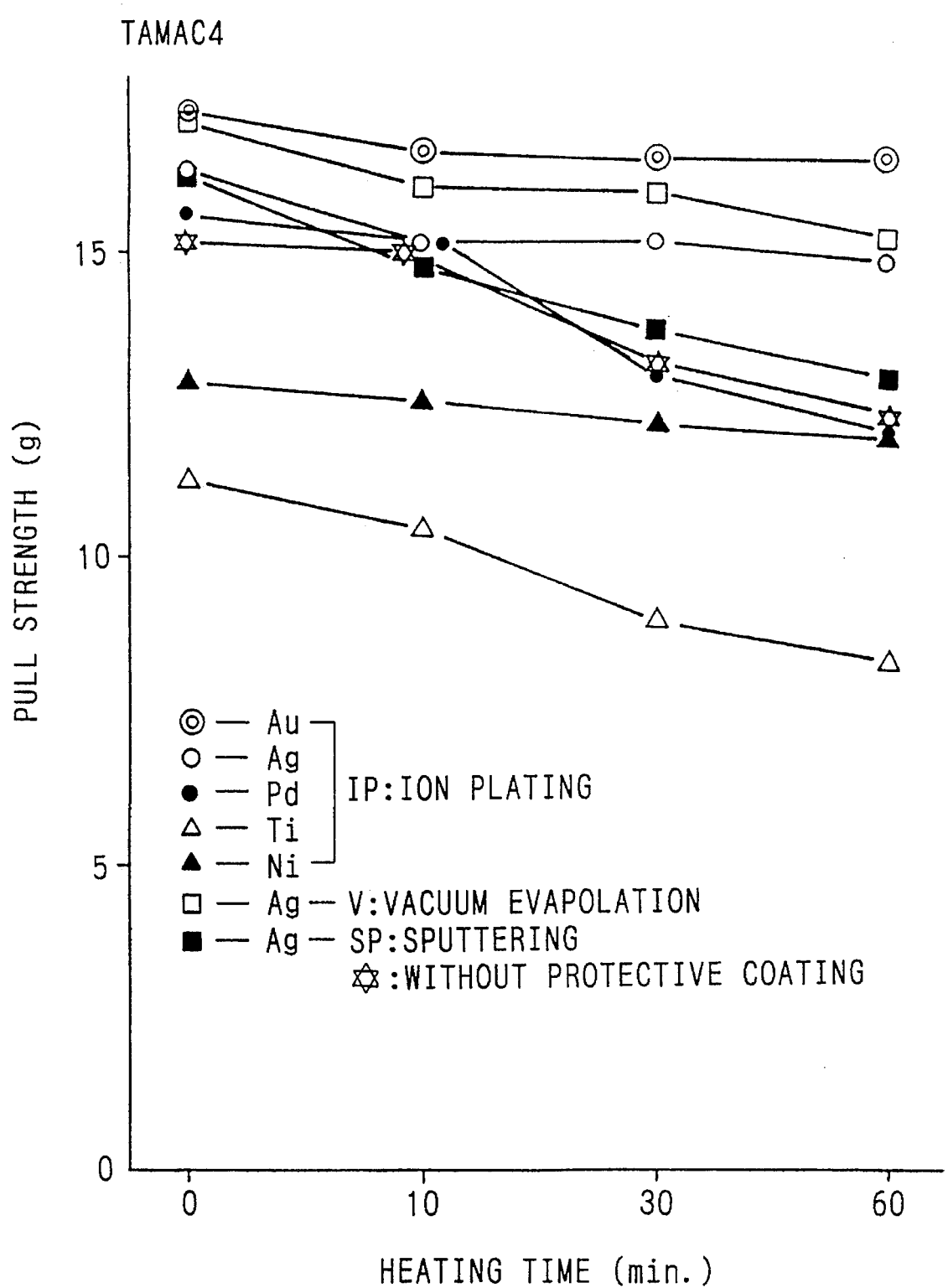
FIG. 4 is a graph showing the relations of deposition materials deposition methods, heating times and pull strengths of wire bonding, in the case where base plates are formed of TAMAC4.
Figure 5:
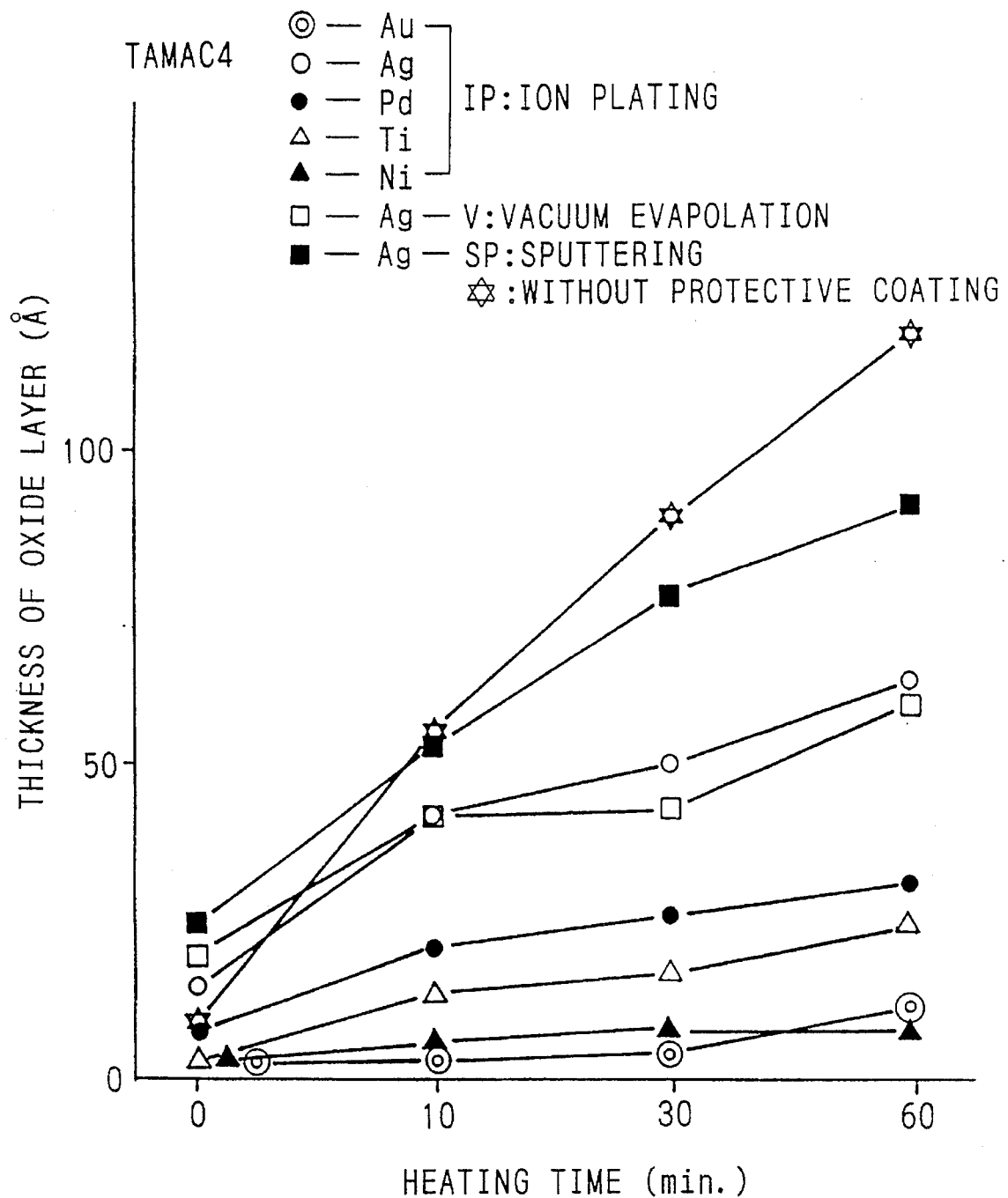
FIG. 5 is a graph showing the relations of deposition materials deposition methods, heating times and thicknesses of oxide layers, in the case where base plates are formed of TAMAC4.
Figure 6:
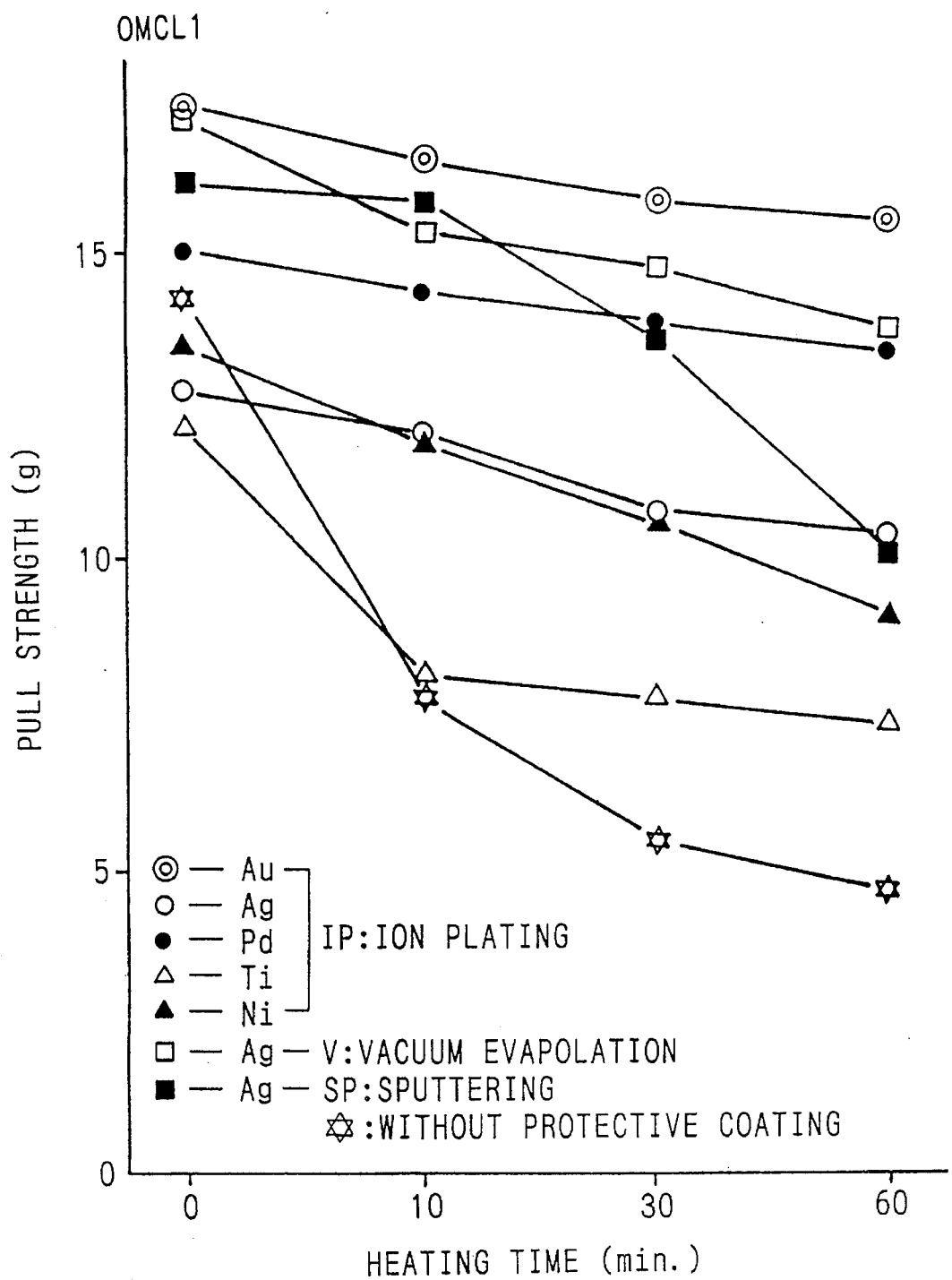
FIG. 6 is a graph showing the relations of the deposition materials deposition methods, heating times and pull strengths of wire bonding, in the case where base plates are formed of OMCL1.
Figure 7:
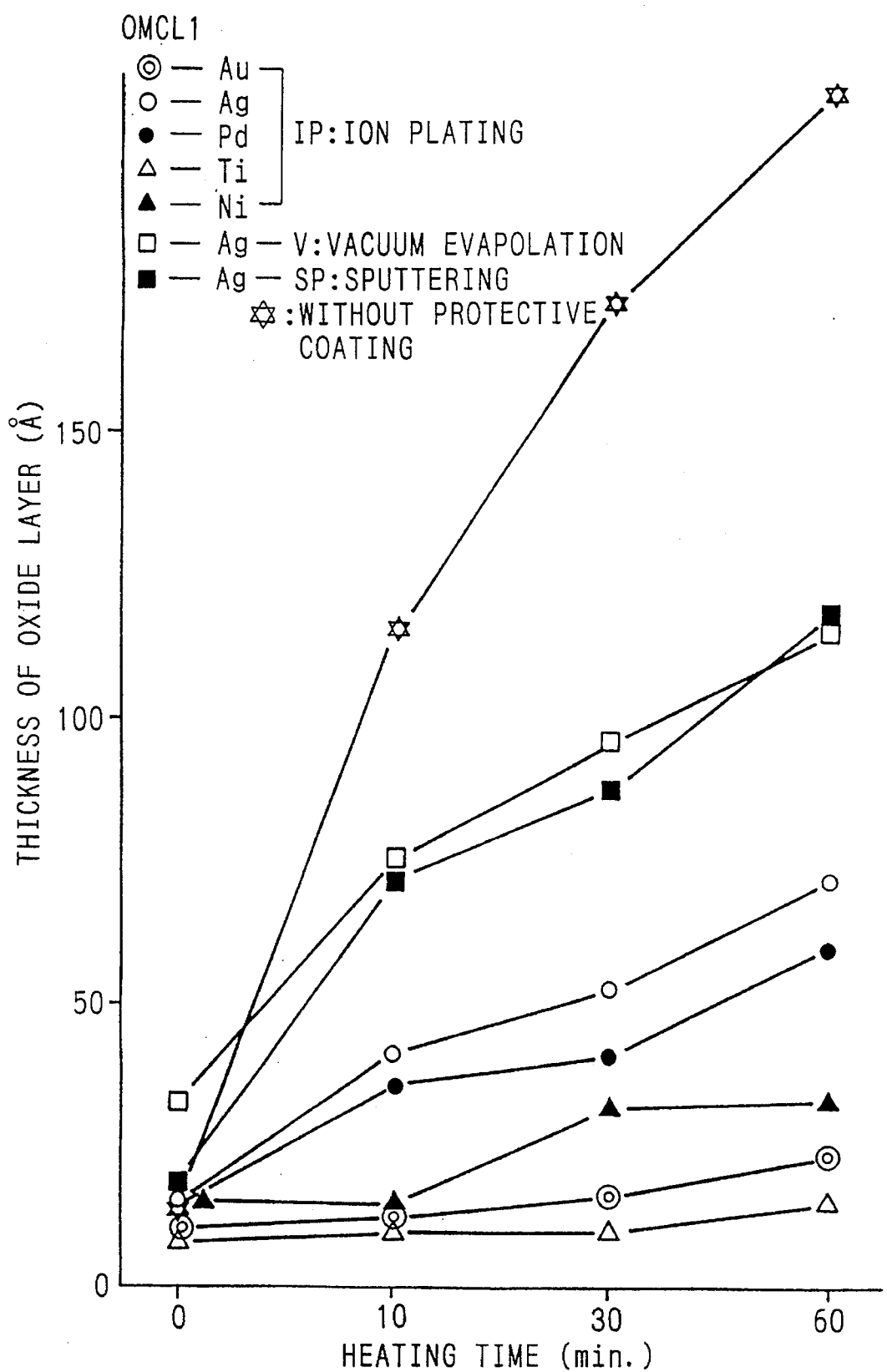
FIG. 7 is a graph showing the relations of the deposition materials deposition methods, heating times and thicknesses of oxidation layers, in the case where base plates are formed of OMCL1.
Figure 8:
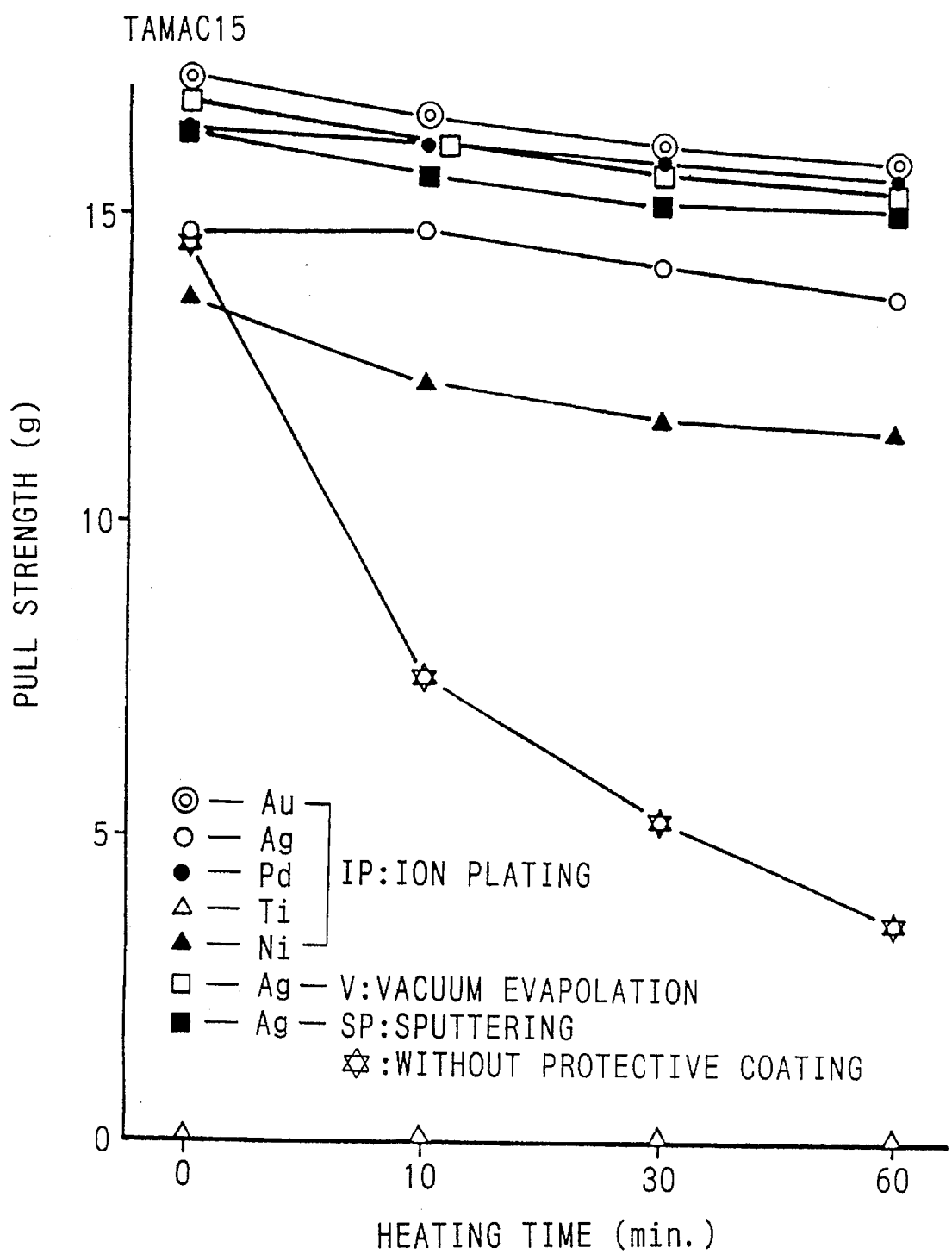
FIG. 8 is a graph showing the relations of deposition materials, deposition methods, heating times and pull strengths of wire bonding, in the case where base plates are formed of TAMAC15.
Figure 9:
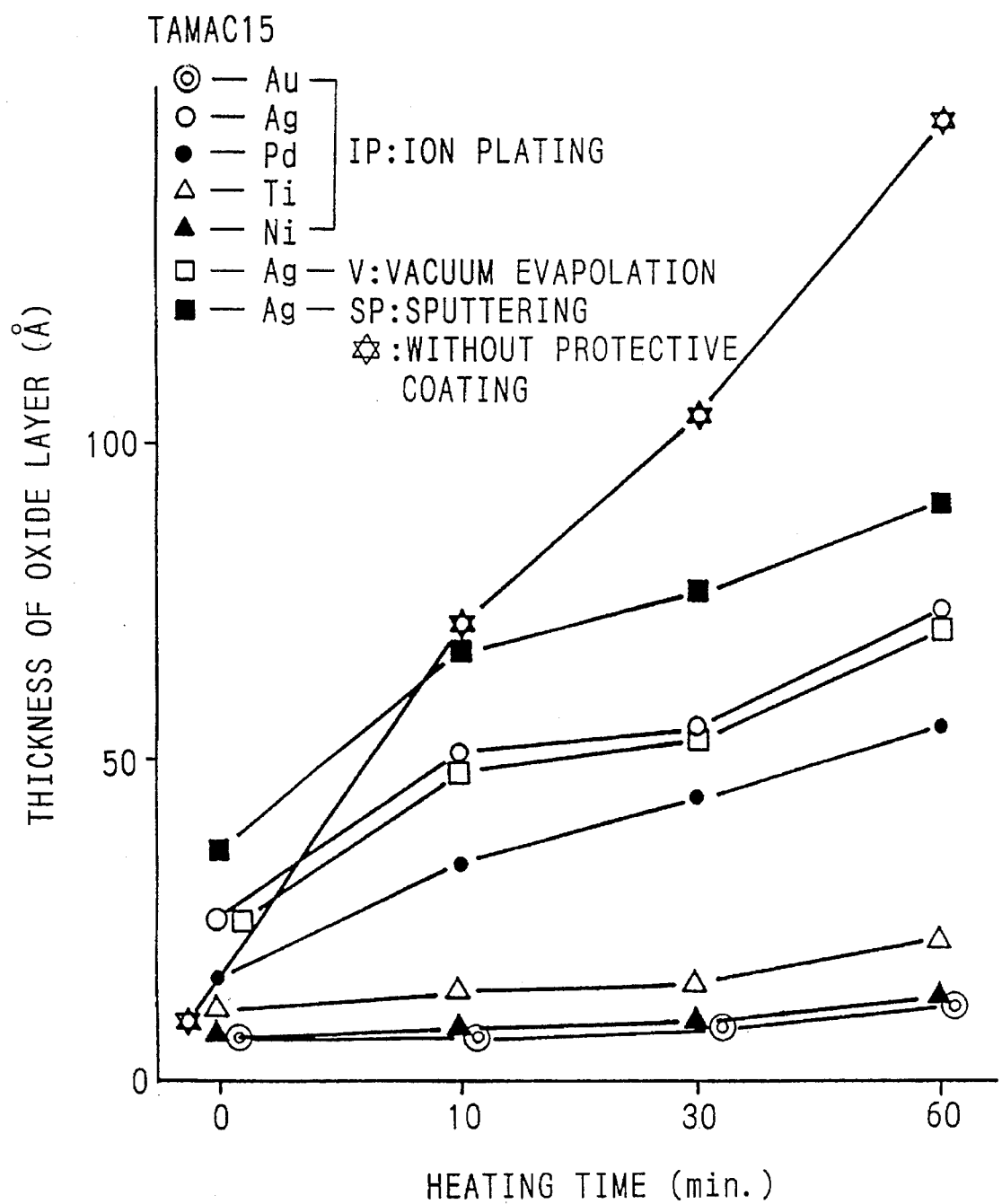
FIG. 9 is a graph showing the relations of deposition materials deposition methods, heating times and thicknesses of oxide layers, in the case where base plates are formed of TAMAC15.

As shown in FIG. 2, the protective coating 2 is formed so as to cover the surfaces of the inner leads 12. However, the present invention is not limited to the embodiments of FIGS. 1 and 2, various modifications are possible. For example, the protective coating 2 can be formed on the whole surface of the base plate 1 or the lead frame body 10, as shown in FIG. 3. Furthermore, the protective coat 2 can be formed on the inner leads 12 only. Additionally, the present invention can be applied to lead frames for not only LSis and IC devices, but also to the lead frames for the other types of semiconductor devices, such as transistors and hybrid circuit devices.

The protective coating 2 is composed of at least one metal selected from the group consisting of gold, gold alloy, silver, silver alloy, palladium and palladium alloy, and has a thickness of 10–500 angstrom. The protective coating 2 is not only limited to a single layer, but also can consist of more than two layers made of different materials. As for the alloys which are suitable for the protective coating 2, the following materials can be listed:

i) Gold alloy including 0–60 wt % of at least one element selected from Cu, Ag and Zn.

ii) Silver alloy including 0–30 wt % of at least one elements selected from Pd, Cu, In and Zn.

iii) Palladium alloy including 0–70 wt % of at least one elements selected from Au, Ni, Ag and Si.

If the thickness of the protective coating 2 is less than 10 angstrom, the bonding strength and the wet-ability for melted solder cannot be sufficiently enhanced. On the other hand, if the thickness of the protective coating is greater than 500 angstrom, it results only in the increasing of manufacturing cost of the lead frame. Considering the manufacturing cost and the above-mentioned effects, the preferable thickness of the protective coating is within the range of 50–300 angstrom. The protective coating 2 laving low thickness cannot completely interrupt the oxidation of the surface of the base plate 1 or the lead frame body 10, as is well known in the prior arts. In spite of this. The inventors have found such very thin protective coating 2 can improve both the strength of the wire bonding and the wet-ability thereof to the melted solder, contrary to the ordinary sense of the skilled person of the prior arts.

The protective coating 2 is preferably formed by means of vapor deposition, such as vacuum evaporation, ion-plating and spattering. The protective coating 2 formed by vapor deposition is finer than a coating formed by wet plating, such as electroplating and electroless plating, and thus, have better effects for enhancing the reliability of the wire bonding of the lead frame 15.

instead of punching the lead frame material 3 on which the protective coating 2 is formed in advance, the lead frame 15 can be manufactured by the following steps:

punching or etching the base plate 1 to form the lead frame body 10; and carrying on vapor deposition, preferably, vacuum evaporation, onto at least a portion including both the leads 12 and 13 of the lead frame body 10 in order to form the protective coating 2.

In this case, the protective coating 2 will be formed not only on the flat surface but also on the peripheral faces of the outer leads 13, and the wet-ability of the peripheral faces can be enhanced. Therefore, it is possible to improve the reliability of soldering of the outer leads 13. In order to efficiently form the protective coating 2 on the peripheral faces of the outer leads 13, it is also effective to decrease the degree of vacuum of the evaporation atmosphere during the vapor deposition. This causes diffusion of the metal vapor stream, and facilitates depositing of the metal on the peripheral faces of the outer leads 13. Tilting the lead frame body 10 against the metal vapor stream during the vapor deposition is also effective to form the protective coating 2 on the peripheral faces of the outer leads 13.

Regarding the material of the base plate 1, all the copper alloys which have been used for the conventional lead frames are available. Representatives of such copper alloys are listed as follows:

Fe (0.1 wt %)—P (0.03 wt %)—Cu (balance): TAMAC4 (a brand name)

Sn (2.0 wt %)—Ni (1.5 wt %)—Si (0.2 wt %)—Zn (0.3 wt %)—Cu (balance): TAMAC15 (a brand name)

Cr (0.3 wt %)—Zr (0.1 wt %)—Si (0.02 wt %)—Cu (balance): OMCL1 (a brand name)

Fe (2.35 wt %)—P (0.03 wt %)—Zn (0.12 wt %)—Cu (balance): CDA alloy No. C19400

Ni (3.2 wt %)—Si (0.8 wt %)—Zn (0.5 wt %)—Cu (balance)

Ni (3.5 wt %)—(0.7 wt %)—Zn (0.3 wt %)—Sn (0.2 wt %)—Cu (balance)

Addition to the above-mentioned materials the inventors have found that the following materials are suitable for the present invention.

a) Korson type copper alloy including 1.5–4.5 wt % of Ni, 0.2–1.0 wt % of Si, 0–4 wt % of Zn and/or Sn, and balance of Cu.

b) Chromium copper alloy including 0.15–0.45 wt of Cr, 0–0.5 wt % of at least one elements selected from Zr, Sn, Zn, Si and Mg, and balance of Cu.

c) Phosphor bronze alloy including 1.5–10 wt % of Sn, 0.004–0.25 wt % of P, 0–1.0 wt % of Zn and/or Ni, and balance of Cu.

d) Beryllium copper alloy of JISH3130 (JIS: Japanese Industrial Standards).

e) Titanium copper including 2–5 wt % of titanium.

f) Nickel silver (Cu—Ni—Zn alloy) of JISH3110 and JISH3130 (JIS).

In particular, in the case where the base plate 1 or the lead frame body 10 is made of a high strength copper alloy including Ni (preferably 1.0–4.0 wt %, more preferably 1.8–4.0 wt %) and/or Si (preferably 0.2–1.0 wt %, more preferably 0.4–0.8 wt %), the effect of the present invention becomes more remarkable.

According to the lead frame material and the lead frame of the present invention, the protective coating 2 improves the bolding strength between the bonding wire and the inner leads 12 of the lead frame 15, and thus improves the reliability of the manufacturing of the semiconductor devices. In spite of this effects, since the protective coating 2 is very thin, the necessary amount of the noble metal can be decreased, and the manufacturing cost thereof is much lower as compared to that of the conventional lead frame having a thick gold layer.

Furthermore, because the protective coating enhances the wet-ability of the lead frame to a melted solder, it is possible to facilitate soldering of the outer leads to a printed circuit board without forming solder layers on the outer leads in advance, and thus the manufacturing cost and complication of manufacturing process of the lead frames can be reduced.

As a modified embodiment, it is possible to form an intermediate coating of nickel or nickel alloys between the surface of the base plate 1 (or the lead frame body 10) and the protective coating 2, by means of vapor deposition or wet plating. The suitable thickness of the Intermediate coating is within the range of 50–20000 angstrom.

In this case, the intermediate coating interrupts the heat diffusion of copper or the other metal from the lead frame body 10 into the protective coating 2, during heat treatment in manufacturing processes of semiconductor devices. Therefore, it becomes possible to carry out the heat treatments of the lead frame 15 under relatively higher temperature for a longer heating time, as compared to the lead frame having no intermediate coating. In contrast, If the copper atoms (or the other metal atoms) diffuse into the protective coating 2, the copper atoms reach the surface of the thin protective coating 2, and the risk arises that the exposed copper atoms will decrease the strength of the wire bonding and wet-ability to a melted solder of the lead frame 15.

If the thickness of the intermediate coating is less than 50 angstrom, the above-mentioned effects cannot be obtained, and, if the thickness is more than 20000 angstrom, the manufacturing cost increases without further improving the effects.

EXAMPLES

Test 1

Base plates of OMCL1, TAMAC4 and TAMAC15 were provided, and a protective coating was formed on each of the base plates by a vapor deposition method selected from vacuum evaporation (indicated as "V" in the tables), ion-plating ("IP") and sputtering ("SP"), as shown in Tables 1–3. The thicknesses of the protective coatings were decided to be 100 angstrom. The condition of each of the vapor depositions were follows:

Vacuum Evaporation: Electron beam vacuum evaporation method
Evaporation pressure: $1-5 \times 10^{-3}$ Pa.

Ion Plating: RF ion plating method
Electric power: 200 W
Applied voltage to the base plate: −50V
Pressure of Argon: $5-10 \times 10^{-2}$ Pa Sputtering: DC magnetron sputtering method
Pressure of Argon: $3-7 \times 10^{-1}$ Pa Next, the lead frame material were heated in the air at 150° C. for 10, 30 or 60 minutes in order to form oxide layers. After measuring the thickness of the oxide layers of the heated lead frame members and the unheated lead frame members, respectively, wire bonding of the following condition were carried out to all the lead frame material, and pull strengths of the bonded wire were measured.

Wire bonding: thermosonic wire bonding
Bonding wire: copper wire of diameter of 25 micrometer
Ball size: 75 micrometer diameter Table 1–3 and FIGS. 4–9 show the results of the measurements. As clearly shown in these tables and the figures, in Examples 1–5 comprising the protective coatings of Au, Ag or Pd, the pull strengths thereof were remarkably enhanced, in spite of the oxide layers formed on the surface of the lead frame members. In particular, when the material of the protective coating is gold, the lead frame members have provided better results in comparison with the protective coating of Ag or Pd. In contrast, when the protective coatings were formed of Ni or Ti, the effect for improving the bonding strength could not be achieved, even though the thicknesses of the oxide layers were equal to or thinner than the cases of Au, Pd and Ag.

TABLE 1

(Lead frame body: TAMAC4)

| | Deposition metal and Deposition method | Thickness of oxide layer (angstrom)/Pull strength (g) | | | |
|---|---|---|---|---|---|
| | | 0 min. heating | 10 min. heating | 30 min. heating | 60 min. heating |
| Example 1 | Au | 3.0 | 5.5 | 7.4 | 10.5 |
| | IP | 17.3 | 16.7 | 16.5 | 16.5 |
| Example 2 | Ag | 14.8 | 42.4 | 49.5 | 63.4 |
| | IP | 16.5 | 15.3 | 15.3 | 14.9 |
| Example 3 | Pd | 8.2 | 20.8 | 26.2 | 31.1 |
| | IP | 15.8 | 15.3 | 13.1 | 12.1 |
| Example 4 | Ag | 20.0 | 42.1 | 43.1 | 59.0 |
| | V | 17.3 | 16.2 | 16.1 | 15.3 |
| Example 5 | Ag | 24.7 | 52.7 | 77.1 | 90.9 |
| | SP | 16.4 | 14.9 | 13.8 | 13.0 |
| Comparative example 1 | Ni | 3.0 | 6.2 | 7.7 | 7.4 |
| | IP | 13.0 | 12.7 | 12.3 | 12.0 |
| Comparative example 2 | Ti | 2.7 | 13.5 | 17.4 | 24.4 |
| | IP | 11.4 | 10.6 | 9.1 | 8.4 |
| Comparative example 3 | Nothing | 8.2 | 57.0 | 89.3 | 116.6 |
| | | 15.3 | 15.2 | 13.3 | 12.3 |

TABLE 2

(Lead frame body: OMCL1)

| | Deposition Metal and Deposition method | Thickness of oxide layer (angstrom)/Pull strength (g) | | | |
|---|---|---|---|---|---|
| | | 0 min. heating | 10 min. heating | 30 min. heating | 60 min. heating |
| Example 6 | Au | 8.5 | 10.2 | 13.7 | 17.2 |
| | IP | 17.3 | 16.4 | 15.8 | 15.5 |
| Example 7 | Ag | 14.8 | 40.7 | 52.1 | 71.1 |
| | IP | 12.8 | 12.1 | 10.8 | 10.4 |
| Example 8 | Pd | 14.1 | 35.4 | 10.5 | 58.8 |
| | IP | 15.1 | 14.4 | 13.9 | 13.4 |
| Example 9 | Ag | 32.0 | 75.3 | 95.3 | 114.1 |
| | V | 17.2 | 15.4 | 14.8 | 13.8 |
| Example 10 | Ag | 17.8 | 71.0 | 87.0 | 116.9 |
| | SP | 16.2 | 15.9 | 13.6 | 10.1 |
| Comparative example 4 | Ni | 14.8 | 13.7 | 31.3 | 32.0 |
| | IP | 13.5 | 11.9 | 10.6 | 9.0 |
| Comparative example 5 | Ti | 7.4 | 8.9 | 9.0 | 13.5 |
| | IP | 12.2 | 8.2 | 7.8 | 7.4 |
| Comparative example 6 | Nothing | 11.4 | 113.5 | 170.5 | 205.6 |
| | | 14.9 | 8.0 | 5.6 | 4.8 |

TABLE 3

(Lead frame body: TAMAC15)

| | Deposition Metal and Deposition method | Thickness of oxide layer (angstrom)/Pull strength (g) | | | |
|---|---|---|---|---|---|
| | | 0 min. heating | 10 min. heating | 30 min. heating | 60 min. heating |
| Example 11 | Au | 7.2 | 7.6 | 8.0 | 11.8 |
| | IP | 17.1 | 16.6 | 16.1 | 15.7 |
| Example 12 | Ag | 24.7 | 50.9 | 55.2 | 73.2 |
| | IP | 14.7 | 14.7 | 14.1 | 13.6 |
| Example 13 | Pd | 16.0 | 33.6 | 43.5 | 54.5 |
| | IP | 16.4 | 16.1 | 15.8 | 15.5 |
| Example 14 | Ag | 25.1 | 48.0 | 52.5 | 70.3 |
| | V | 16.8 | 16.1 | 15.6 | 15.3 |
| Example 15 | Ag | 35.5 | 66.8 | 75.5 | 89.7 |

TABLE 3-continued (Lead frame body: TAMAC15)

|  | Deposition Metal and Deposition method | Thickness of oxide layer (angstrom)/Pull strength (g) | | | |
|---|---|---|---|---|---|
|  |  | 0 min. heating | 10 min. heating | 30 min. heating | 60 min. heating |
|  | SP | 16.3 | 15.6 | 15.1 | 15.0 |
| Comparative example 7 | Ni | 7.3 | 8.3 | 8.6 | 13.1 |
|  | IP | 13.6 | 12.2 | 11.6 | 11.4 |
| Comparative example 8 | Ti | 11.4 | 14.2 | 14.5 | 21.9 |
|  | IP | 0.0 | 0.0 | 0.0 | 0.0 |
| Comparative example 9 | Nothing | 9.2 | 70.1 | 103.0 | 148.2 |
|  |  | 14.5 | 7.5 | 5.2 | 3.5 |

Test 2

Base plates of TAMAC15 were provided, and protective coatings of Ag having thicknesses of 5, 10, 25, 50, 75, 100 and 200 angstrom were formed on the base plates by vacuum evaporation under the condition described in Test 1. Next, these lead frame material were heated in air at 150° C. for 10, 30 or 60 minutes in order to form oxide layers, and furthermore, the thicknesses of the oxide layers and the bonding strengths were measured as described in Test 1. The results are shown in Table 4 and FIGS. 10 and 11.

Figure 10:
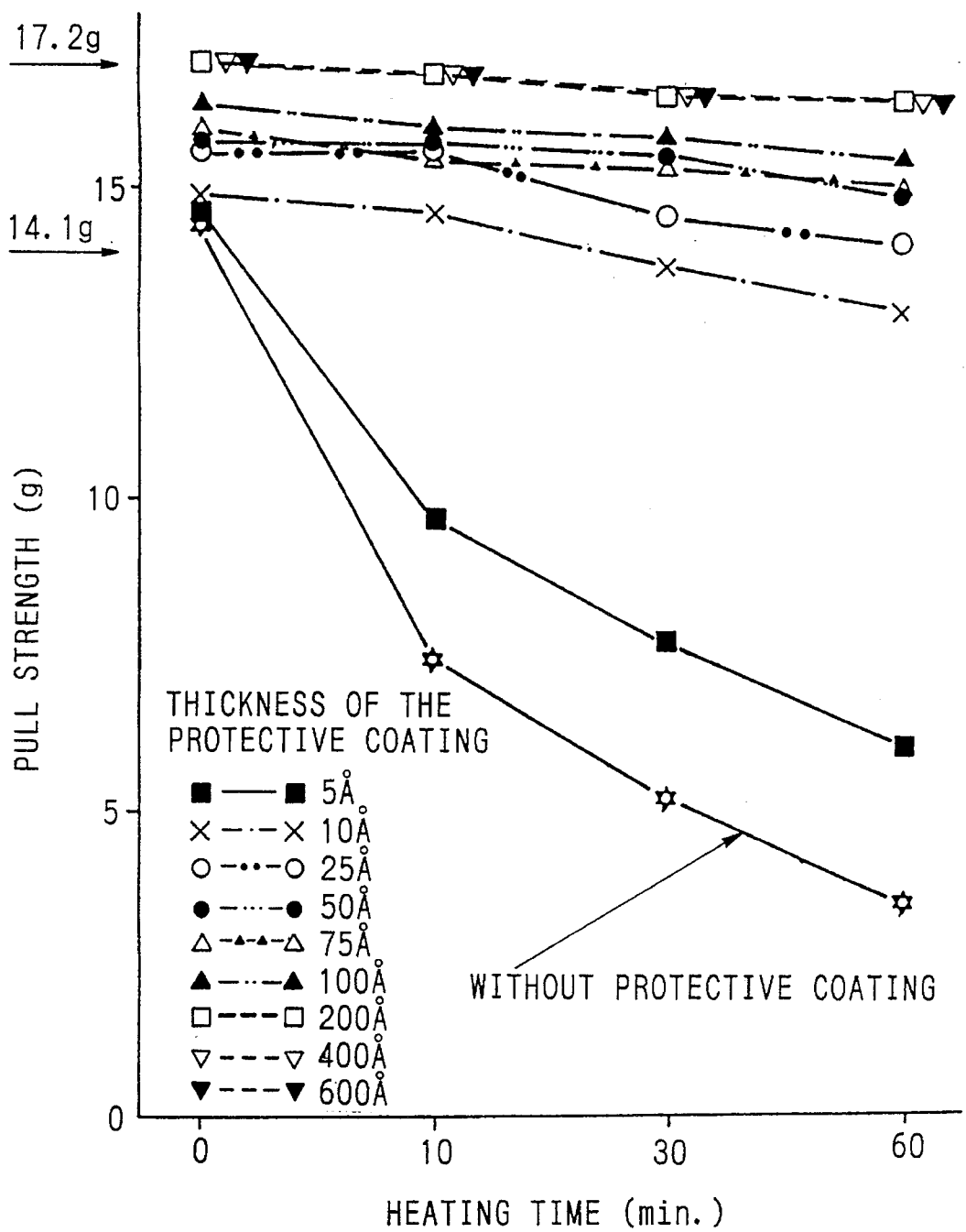
FIG. 10 is a graph showing the relations of thicknesses of protective coatings, heating times and pull strengths of wire bonding, in the case where base plates are formed of TAMAC15.

As shown in Table 4 and FIGS. 10 and 11. The protective coating having a thickness of more than 10 angstrom could improved the pull strength remarkably, in spite of the existence of the oxide layer on the surface of the lead frame material.

Temperature of melted solder: 225°–235° C.

Method of soldering: dipping

Dipping time: 5 sec.

Flux: rosin 25 wt%+methanol 75 wt %

The wet-ability was estimated by measuring an area ratio of the area wetted with melted solder to the area dipped into the melted solder. The results are shown in Table 5. As shown in Table 5, the protective coating having a thickness of more than 10 angstrom can remarkably improved the wet-ability.

TABLE 4

(Lead frame body: TAMAC15)

|  | Thickness of protective coating (angstrom) | Thickness of oxide layer (Angstrom)/Pull strength (g) | | | |
|---|---|---|---|---|---|
|  |  | 0 min. heating | 10 min. heating | 30 min. heating | 60 min. heating |
| Comparative example 10 | 5 | 40.2 | 60.1 | 91.5 | 136.4 |
|  |  | 14.6 | 9.8 | 7.9 | 6.1 |
| Example 16 | 10 | 40.1 | 58.9 | 76.2 | 102.4 |
|  |  | 15.0 | 14.7 | 13.9 | 13.2 |
| Example 17 | 25 | 28.9 | 54.2 | 67.4 | 78.7 |
|  |  | 15.7 | 15.7 | 14.6 | 14.0 |
| Example 18 | 50 | 26.4 | 44.2 | 58.7 | 69.5 |
|  |  | 15.9 | 15.8 | 15.6 | 14.6 |
| Example 19 | 75 | 26.7 | 49.1 | 58.0 | 68.7 |
|  |  | 16.1 | 15.6 | 15.4 | 15.1 |
| Example 20 | 100 | 39.1 | 57.4 | 71.8 | 94.4 |
|  |  | 16.5 | 16.1 | 15.9 | 15.5 |
| Example 21 | 200 | 19.8 | 30.2 | 34.4 | 39.2 |
|  |  | 17.2 | 17.0 | 16.6 | 16.5 |
| Example 22 | 400 | 19.0 | 29.9 | 32.8 | 38.4 |
|  |  | 17.2 | 17.1 | 16.6 | 16.5 |
| Comparative example 11 | 600 | 16.2 | 28.9 | 30.7 | 38.1 |
|  |  | 17.2 | 17.1 | 16.7 | 16.5 |

Test 3

Base plates of TAMAC15 were provided, and protective coatings of Pd having thicknesses of 5, 10, 25, 50, 75, 100 or 200 angstrom were formed on the base plates by the vacuum evaporation under the condition described above, and lead frame members were provided. These lead frame material were heated in water steam at 100° C. for 60 minutes in order to form oxide layers (steam aging treatment), and the wettability of the lead frame members to a melted solder were measured at the following condition.

Composition of solder: Sn (90 wt %)—Pb (10 wt %)

TABLE 5

(Lead frame body: TAMAC15)

| Thickness of protective coating (angstrom) | No coating (No aging) | 5 | 10 | 25 | 50 | 75 | 100 | 200 |
|---|---|---|---|---|---|---|---|---|
| Wet area ratio (%) | 100 | 35 | 50 | 95 | 100 | 100 | 100 | 100 |

TABLE 6

(Lead frame body: TAMAC15)

| Thickness of protective coating (angstrom) | No coating | 5 | 10 | 25 | 50 | 75 | 100 | 200 |
|---|---|---|---|---|---|---|---|---|
| Wet area ratio (%) | | | | | | | | |
| Group A | 0 | 0 | 0 | 0 | 0 | 0 | 0 | 0 |
| Group B | 0 | | 25 | 45 | 90 | 95 | 100 | 100 | 100 |

Test 4

Base plates made of TAAC15 of 0.15 millimeter thickness were provided and divided into two Groups A and B. Regarding the Group A, protective coatings of Pd having thicknesses of 5, 10, 25, 50, 75, 100 and 200 angstrom were formed on the base plates by vacuum evaporation under the evaporation pressure of $2 \times 10^{-2}$ Pa, and the lead frame members were punched in order to form lead frames.

On the other hand. The base plates of Group B were punched to form lead frame bodies having same shape to Group A, and protective coatings of Pd having thicknesses of 5, 10, 25, 50, 75, 100 and 200 angstrom were formed on the lead frame bodies by the vacuum evaporation under the identical condition to Group A.

Both the lead frames of Groups A and B were heated in the air at 300° C. for 5 minutes in order to form oxide layers, then, the wet-ability of the peripheral faces of the lead frames to melted solder were measured by means of the same method as Test 4. The results are shown in Table 6. The wetted area ratios of the lead frames of Group A were almost 0. In contrast, the lead frames of Group B, having the protective coatings of more than 10 angstrom thick, had shown good wet-ability to melted solder at the peripheral faces.

What is claimed is:

1. A lead frame material for manufacturing lead frames comprising:
   a base plate consisting of copper or copper alloys;
   at least a protective coating formed by vapor deposition on at least part of a surface of said base plate; and
   an intermediate coating formed between said surface of said base plate and said protective coating;
   wherein said protective coating is composed of at least one metal selected from the group consisting of gold, gold alloy, silver, silver alloy, palladium and palladium alloy, said protective coating has a thickness of 10–500 angstrom and said intermediate coating is composed of nickel or nickel alloys and has a thickness of 50–20,000 angstrom.

2. The lead frame material according to claim 1, wherein said base plate is made of a high strength copper alloy including at least one of Ni of 1.5–4.5 wt % and Si of 0.2–1.0 wt %.

3. The lead frame material according to claim 1, wherein said protective coating is composed of an alloy selected from the group consisting of:
   gold alloy including less than 60 wt % of at least one element selected from Cu, Ag, and Zn;
   silver alloy including less than 30 wt % of at least one element selected from Pd, Cu, In, and Zn; and
   palladium alloy including less than 70 wt % of at least one element selected from Au, Ni, Ag, and Si.

4. The lead frame material according to claim 1, wherein the thickness of said protective coating is in the range of 50–300 angstrom.

5. The lead frame material according to claim 1, wherein said intermediate coating is a vapor deposition coating.

6. A lead frame for semiconductor device comprising:
   a lead frame body having inner leads to be wire-bonded and outer leads to be bonded to circuit patterns of a printed circuit board, said frame body consisting of copper or copper alloys;
   first protective coatings formed by vapor deposition on surfaces of said inner leads of said lead frame body; and
   intermediate coatings formed between said surfaces of said inner leads and said first protective coatings;
   wherein said first protective coatings are composed of a metal selected from the group consisting of gold, gold alloy, silver, silver alloy, palladium and palladium alloy, said protective coating has a thickness of 10–500 angstrom, and said intermediate coatings are composed of nickel or nickel alloys and have a thickness of 50–20,000 angstrom.

7. The lead frame according to claim 6 further comprising second protective coatings formed on the surface of said outer leads of said lead frame body, wherein said second protective coatings are composed of at least one metal selected from the group consisting of gold, gold alloy, silver, silver alloy, palladium and palladium alloy, and said second protective coatings have a thickness of 10 . 500 angstrom.

8. The lead frame according to claim 7 further comprising second intermediate coatings formed between said outer leads and said second protective coating, wherein said second intermediate coatings are composed of nickel or nickel alloys and have a thickness of 50–20000 angstrom.

9. The lead frame according to claim 6, wherein said lead frame body is made of a high strength copper alloy including at least one of Ni of 1.5–4.5 wt % and Si of 0.2–1.0 wt %.

10. The lead frame according to claim 6, wherein said protective coating is composed of an alloy selected from the group consisting of:
    gold alloy including less than 60 wt % of at least one element selected from Cu, Ag, and Zn;
    silver alloy including less than 30 wt % of at least one element selected from Pd, Cu, In, and Zn; and
    palladium alloy including 70 wt % of at least one element selected from Au, Ni, Ag, and Si.

11. The lead frame according to claim 6, wherein the thickness of said protective coating is in the range of 50–300 angstrom.

12. The lead frame according to claim 6, wherein said intermediate coatings are vapor deposition coatings.

* * * * *

UNITED STATES PATENT AND TRADEMARK OFFICE
CERTIFICATE OF CORRECTION

PATENT NO. : 5,510,197
DATED : April 23, 1996
INVENTOR(S) : Takahashi et al.

Page 1 of 2

It is certified that error appears in the above-indentified patent and that said Letters Patent is hereby corrected as shown below:

Column 1, line 9, delete "bolding" and insert --bonding--;
line 20, delete "bolding" and insert --bonding--; and
line 22, delete "bolding," and insert --bonding,--.

Column 2, line 9, delete "for necessary" and insert --necessary for--.

Column 3, line 6, after "materials" insert --,-- (comma);
line 10, after "materials" insert --,-- (comma);
line 14, after "materials" insert --,-- (comma);
line 18, after "materials" insert --,-- (comma); and
line 26, after "materials" insert --,-- (comma).

Column 4, line 9, delete "LSis" and insert --LSIs--;
line 25, delete "elements" and insert --element--;
line 27, delete "elements" and insert --element--;
line 36, delete "laving" and insert --having--;
line 39, delete "this. The" and insert --this, the--; and
line 51, delete "instead" and insert --Instead--.

Column 5, line 22, before "(0.7 wt %)" insert --Si--;
line 24, delete "Addition" and insert --In addition--;

UNITED STATES PATENT AND TRADEMARK OFFICE
CERTIFICATE OF CORRECTION

PATENT NO. : 5,510,197
DATED : April 23, 1996
INVENTOR(S) : Takahashi et al.

It is certified that error appears in the above-indentified patent and that said Letters Patent is hereby corrected as shown below:

Column 5, line 50, delete "bolding" and insert --bonding--.

Column 6, line 1, delete "Intermediate" and insert --intermediate--;
line 10, delete "If" and insert --if--; and
line 40, delete "-50V" and insert -- -150V --.

Column 11, line 26, delete "TAAC15" and insert --TAMAC 15--; and
line 33, delete "hand. The" and insert --hand, the--.

Column 12, line 40, (claim 7, line 7) delete "10 . 500" and insert --10-500--.

Signed and Sealed this

Fifth Day of November, 1996

BRUCE LEHMAN

Attest:

Attesting Officer

Commissioner of Patents and Trademarks